United States Patent [19]
Ishizuka

[11] Patent Number: 4,587,637
[45] Date of Patent: May 6, 1986

[54] MEMORY SYSTEM

[75] Inventor: Hisao Ishizuka, Tokyo, Japan

[73] Assignee: NEC Corporation, Tokyo, Japan

[21] Appl. No.: 555,739

[22] Filed: Nov. 28, 1983

[30] Foreign Application Priority Data

Nov. 26, 1982 [JP] Japan .............................. 57-206992

[51] Int. Cl.[4] ............................................ G11C 13/00
[52] U.S. Cl. .................................... 365/189; 365/230
[58] Field of Search .............. 365/189, 230, 190, 191, 365/220, 233

[56] References Cited
U.S. PATENT DOCUMENTS
4,419,746 12/1983 Hunter et al. ...................... 365/189

Primary Examiner—Terrell W. Fears
Attorney, Agent, or Firm—Sughrue, Mion, Zinn, Macpeak, and Seas

[57] ABSTRACT

A memory system is improved such that a plurality of data are simultaneously read-out from a memory array and at least two data are selected out of the read-out data by a single address. Another data is simultaneously read out from another memory block by the same address and applied to at least two arithmetic devices to which the former at least two data are respectively applied. Further, means for writing data to the memory array in parallel with the read-out operation is provided, so that the data computation can be executed continuously without waiting until the data writing operation is terminated.

11 Claims, 3 Drawing Figures

MEMORY SYSTEM

BACKGROUND OF THE INVENTION

1. Field of the Invention

The present invention relates to a memory system, and more particularly, to an improved memory access circuit (addressing circuit) used in a digital data processing system in which a large amount of data are handled.

2. Description of the Prior Art

In the digital data processing field, the amount of data to be handled has remarkably increased with improvements in data processing techniques. Therefore, of particular interest in the digital data processing field is how quickly a large amount of data can be processed.

A memory is invariably employed in digital data processing. Digital data processing speed can be increased by reducing the memory access time (read time and write time). Reducing memory access time is particularly effective in a system that handles a large amount of data. Examples of such systems are a speech recognition system and a picture information processing system. In a data processing system for the speech recognition system, the dynamic pattern matching (DP matching) method is generally employed. This method feature vector data is extracted from the input speech information to be recognized and employed as input patterns. Each feature vector is compared with previously stored reference patterns (standard patterns) to find a standard pattern which most closely corresponds with the input pattern to thereby recognize the input speech. The input patterns and the reference patterns are generally represented as a time series of feature vectors of speech. The feature vector includes, as its components, intensities in various frequency bands obtained by the speech frequency analysis and parameters obtained by a linear predictive analysis. For the pattern matching, it is required to obtain a distance between an input pattern vector $a_i$ at a point in time i and a standard pattern vector $b_j$ at a point of time j, i.e., $d_{i,j}$, (e.g., the sum total of the differencies between the various vector components). Therefore, for obtaining one distance $d_{i,j}$, it is necessary to read out two data trains $a_i$, $b_j$ from a memory and feed these data trains into an arithmetic device. Since pattern data are generally large-capacity data (assuming that the sound voiced for one second requires eight kilobits, the sound voiced for 100 seconds requires 800 kilobits), memory devices independent of each other are employed for storing input patterns and storing standard patterns. respectively.

In general, the time required from the point of time when necessary pattern data are read out from the respective memory devices by memory access operations until the point of time when these pattern data are fed into an arithmetic device is much longer than the execution time of the arithmetic device required to execute a distance computation. Moreover, at least two data signals (an input pattern and a standard pattern) are always required for executing the distance computation. The arithmetic device cannot start the computation for obtaining a distance value until these two data signals have been received, so that the data processing of the prior art is exceedingly low in efficiency.

A major cause for the low efficiency is that the conventional memory system cannot overlap the cycle for reading out data from the memory with the cycle for computing a distance value. Moreover, if a RAM having a working area is used as a memory for storing the input pattern and the reference pattern, another cycle for writing the next new data to be used by the artithmetic device into the RAM is required, so that the data processing speed becomes lower.

Since speech recognition processing cannot be put to practical use if the response time is long from the point in time when speech is received until the point in time when the result of recognition is delivered, the data processing must be completed within a short period of time. As the number of input patterns is larger, matching takes a longer time, and as the recognition data processing speed is lower, the number of recognized words is smaller. Accordingly, the memory access speed is a significant factor to process data efficiently. However, by a conventional memory system, the arithmetic device must wait for data for long time as described above, so that a high-speed processing can not be obtained. On the other hand, the manufacture of a memory device having a high access speed has limitation in the device process technique. Therefore, the apparent access time must be reduced by improving both read-out and writing circuits in the memory system. However, if the circuit configuration is complicated by this improvement, it is difficult to form the memory device on an integrated semiconductor chip, so that a plurality of chips must be combined to form the memory system. In such a case, the critical path among the chips becomes long; hence, the memory access time becomes long. Accordingly, peripheral circuits of a memory array must be as simple as possible.

SUMMARY OF THE INVENTION

Objects of the Invention

It is an object of the present invention to provide a memory system having a short apparent access time.

It is another object of the present invention to provide a memory system reduced in memory access time by means of simple peripheral circuits.

It is still another obejct of the present invention to provide a memory system suitable for use in a digital data processing system which handles a large amount of information.

It is a further object of the present invention to provide a memory system having such an architecture that the read-out operation and the writing operation can be executed in parallel with each other.

Brief Summary of the Invention

The memory system in accordance with the present invention includes: first and second memory blocks; first and second arithmetic devices; an addressing means for supplying a first address commonly to the first and second memory blocks; means for simultaneously reading out first and second data from the first memory block by the first address during a one memory access period; means for reading a third data from the second memory block by the first address during the one memory access period simultaneously with the reading out of the first and second data; and means for supplying the first and third data to the first arithmetic device and simultaneously supplying the second and third data to the second arithmetic device.

As a result, at least two data can be accessed and processed by only one address. Accordingly, the apparent access time can be extremely reduced. For instance, by simultaneously reading out two input patterns and a standard pattern in accordance with the invention, two distance calculations can be executed in parallel with each other, which is exceedingly effective for a high-speed data processing.

Furthermore, if such a memory is employed that has a memory capacity larger than the amount of data used for two distance calculating operations, it is possible to write, during the distance calculating operations, an input pattern and/or a standard pattern to be subjected to a subsequent calculating operation into the memory while overlapping the calculating cycles. Accordingly, it becomes possible to effect a continuous memory access without discontinuing the distance calculating operation, so that data can be processed at a higher speed. It is to be noted that in such a case there is a need for a memory capable of supplying a write address and a read address independently of each other (e.g., a memory having cells each constituted by three transistors in which a read address line and a write address line are separated from each other). Such a memory system can be provided by the following arrangement:

The memory system comprises: at least two memory blocks A, B; a first addressing means for writing data into a first memory block A; a second addressing means for writing data into a second memory block B; a third addressing means for reading data in common out of both the first and the second memory blocks A and B; and a data output means for simultaneously delivering data at two or more address locations of the first memory block A as well as delivering data at one or more address locations of the second memory block B in the same period, wherein one data stored at the memory location of the first memory block A specified by the read address and the other data stored at the other memory location of the first memory block A corresponding to the other address different from the read address are simultaneously delivered by the data output means, while a data of the memory block B is also simultaneously delivered in response to the third addressing means and the second addressing means.

According to the invention, at least two input pattern data stored at addresses physically different from each other can be simultaneously read out of the first memory block A in parallel with the read operation of a reference pattern data of the second memory block B in one memory access time; hence, the memory access time is greatly reduced. Accordingly, the memory system in accordance with the present invention can be well applied to the picture processing field or data processing field in which a large amount of data are handled, in addition to the above-mentioned speech processing field.

DESCRIPTION OF THE PREFERRED EMBODIMENTS

Figure 1:
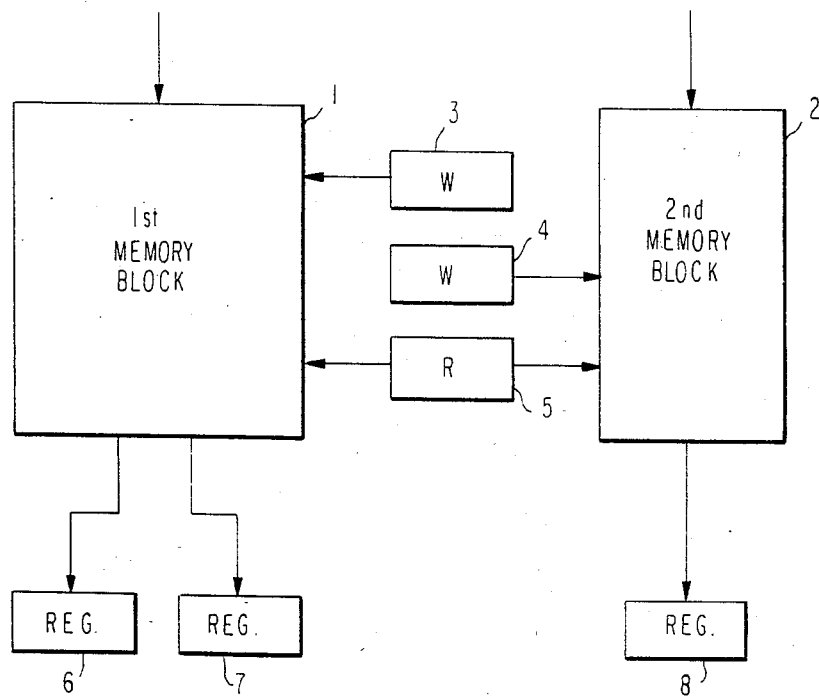
FIG. 1 shows a block diagram of the one embodiment of the present invention.

FIG. 1 is a block diagram of an essential part of a memory system in accordance with an embodiment of the present invention. The memory system shown in FIG. 1 includes: a memory array 1 constituted by N rows and M columns; a memory array 2 constituted by two rows and M columns; a write addressing circuit 3 for the memory array 1; a write addressing circuit 4 for the memory array 2; a read addressing circuit 5 in common to both the memory arrays 1, 2; registers 6, 7 each storing different data signals delivered from the memory array 1; and a register 8 for storing the data delivered from the memory array 2. The read addressing circuit 5 is constituted by a row specifying section and a column specifying section. The column designation in the memory arrays 1, 2 is effected by the column specifying section of the circuit 5. Addressing the rows in the memory arrays 1, 2 to effect transfer of the data from the addressed rows to the registers 6, 7, 8, respectively, is effected as follows. To address the data for transfer to register 6, the data on the row specified by the row specifying section of the read addressing circuit 5 is read out and set into register 6. To transfer data to register 7, the data on the row selected by an address value obtained by adding one to the address value specified by the row specifying section of the read addressing circuit 5 is read out and set into register 7. To transfer data to register 8, the data in either the first or second row of the memory array 2, the specific row being specified by the row specifying section of the read addressing circuit 5 for the memory array 2, is read out and set into register 8. More specifically, when the row specifying section of the read addressing circuit 5 is an address value "1", the data in the second row is set in the register 8. When the row specifying section is an address value "2", the data in the first row is set therein. On the other hand, when the row specifying section of the read addressing circuit 5 indicates an address value "N", the data which is to be delivered to the register 7 is the data in the first row of memory array 1, the addition of one to the address "N" producing the address "1". In this case, the row specifying sections of the two addressing circuits 3, 5 should be modulo N counters, respectively, while the row specifying section of the write addressing circuit 4 should be a modulo 2 counter.

Figure 2:
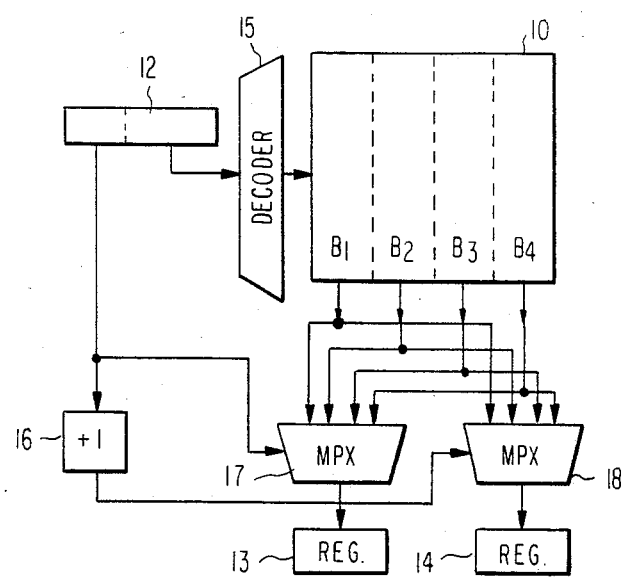
FIG. 2 shows a more detail block diagram of another embodiment of the present invention.

The memory array 1, the read addressing circuit 5 and the registers 6, 7 are shown in FIG. 2 in detail. A memory array 10 (corresponding to the memory array 1 shown in FIG. 1) is divided into, for example, four banks also called (blocks or rows). An output line, having access to each column of the block to which it is attached, extends from each block. The low-order bits of an address set (value) in an address register 12 are decoded in a decoder 15 to specify a column address common to all four banks. As a result, four data signals at the same column location in the respective four banks are simultaneously read out. The read-out four data signals are fed into two multiplexors 17, 18. These multiplexors are each coupled to the output stage of each of the four banks so that each multiplexor receives the four data signals from the four columns addressed by register 12. The multiplexor 17 is adapted to select one of the four data signal according to the value of two high-order bits of the address register 12 and to set the selected data in an output register 13. Moreover, the two high-order bit address is incremented by one by means of a +1 adder 16 and supplied to the multiplexor 18. The multiplexor 18 selects the one of the four banks corresponding to the bank having an address one greater than the bank designated by the two high order bits of register 12. The data in the thus selected bank at the selected column is then transferred to an output register 14. As a result, two data signals at memory locations physically different from each other are simultaneously accessed by only one address in an address register. If the four banks are denoted by $B_1$ to $B_4$, respectively, for example, when the high-order bits of the addresses are (0, 0), (0, 1), (1, 0), (1, 1), the multiplexor 17 specifies the banks $B_1$, $B_2$, $B_3$, $B_4$, respectively. In this case, the outputs of the +1 adder 16 are (0, 1), (1, 0), (1, 1), (0, 0), respectively. Therefore, the multiplexor 18 selects the banks $B_2$, $B_3$, $B_4$, $B_1$, respectively. As a result, two data signals from the following pairs of banks are simultaneously set in the registers 13, 14, respectively: the pair consisting of the banks $B_1$ and $B_2$; the pair consisting of the banks $B_2$ and $B_3$; the pair consisting of the banks $B_3$ and $B_4$; and the pair consisting of the banks $B_4$ and $B_1$. Thus, a pair of data signals can be simultaneously read out with a single address by constituting the read addressing circuit (represented by a reference numeral 5 in FIG. 1) to include the address register 12, the decoder 15, the +1 adder 16 and the multiplexors 17, 18 as shown in FIG. 2 and by dividing the memory array 10 into a plurality of blocks. Accordingly if one of a set of two data signals is an input pattern, while the other is a standard (reference) pattern, it is possible to read out two data signals employed in a distance calculating operation within a period of time equal to one only one memory access cycle.

Moreover, if the memory array 2 is included in the memory system as shown in FIG. 1, the following memory system can be obtained. If input patterns are stored in the memory array 1, standard patterns may be stored in the memory array 2. The input pattern memory array 1 and the standard pattern memory array 2 are both accessed by the read addressing circuit 5. Therefore, even if only one input pattern is read out from the memory array 1 at a time, since an input pattern and a standard pattern as a set are simultaneously read out, the time required for the preparation of data for a distance calcuting operation, for example is reduced to about half the time ordinarily needed. In addition, since the memory array 1 and the memory array 2 are arranged so as to have the same number of columns, an operand (input pattern) and an operand (standard pattern) employed for the identification of the former operand can be accessed by the use of the same address, making addressing of these two data signals remarkably simple.

In the speech processing field, the speech pattern varies every time sound is voiced, and this variation with time must be removed to effect pattern matching. Therefore, it is necessary to provide a certain range between the point in time i of the input pattern vector and the point in time j of the standard pattern vector to obtain pattern matching. A more accurate matching can be obtained by effecting a pattern matching within a range of (2r+1), for example, as follows:

$$j-r \leq i \leq j+r$$

According to the example, the following input patterns, whose distances from a standard pattern $b_j$ at a point in time j are j−r, j−r+1, . . . , j+r, are obtained:

$$a_{j-r}, a_{j-r+1}, \ldots, a_{j+r}$$

Figure 3:
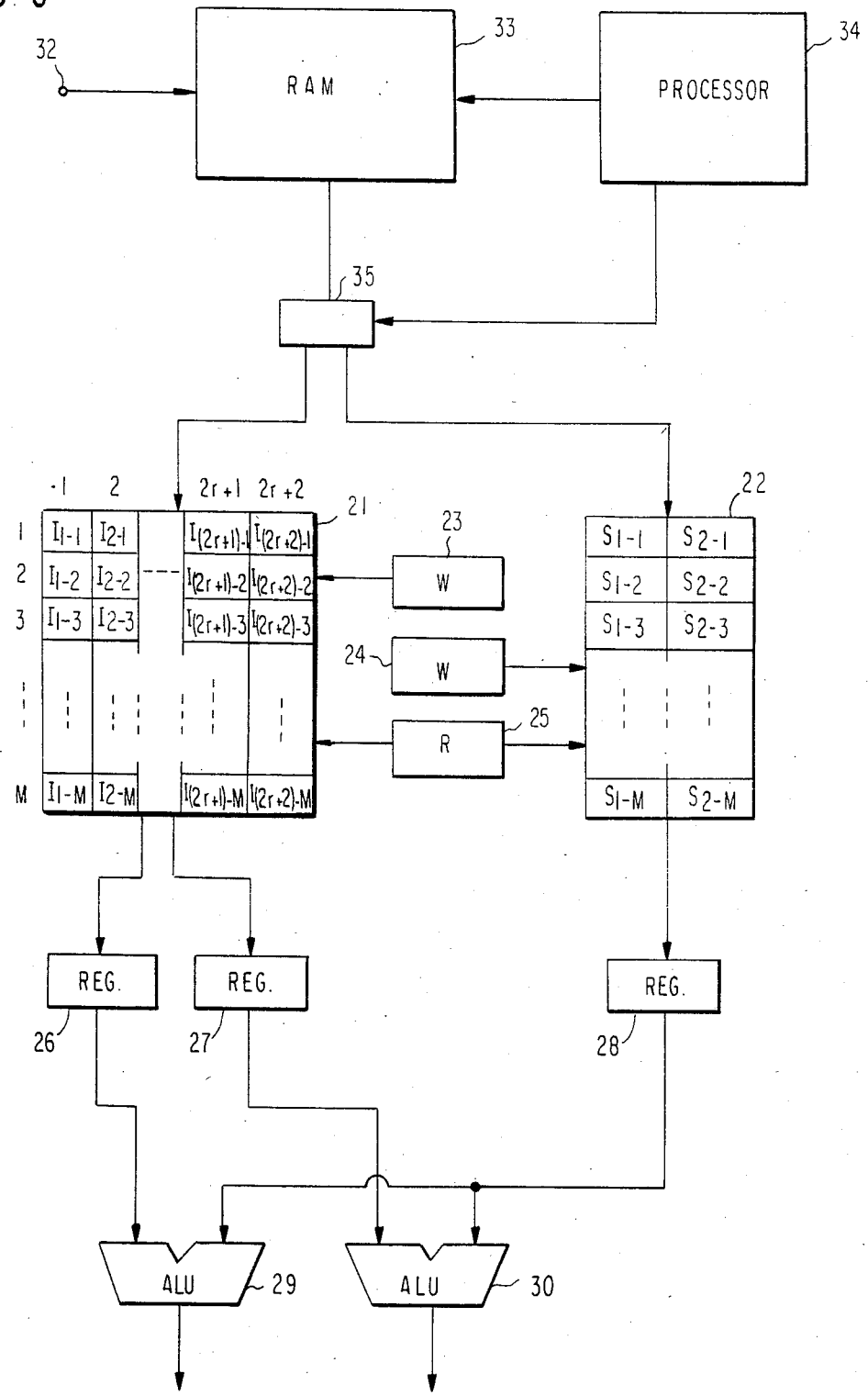
FIG. 3 shows a partial block diagram of a speech recognition system in which the present invention is used.

A preferred example of a matching processing will be described hereinunder with specific reference to FIG. 3. In this case, the dimensions of pattern vectors are assumed to be M, N>2r+1.

Speech data to be recognized is transferred through an input terminal 32 to a memory 33 in which standard pattern data to be compared with the speech data is stored. A processor 34 reads the speech data (input pattern vector) and the standard pattern data (standard pattern vector) out of the memory 33, respectively, and transfers the input pattern data and the standard pattern data to a memory array 21 and a memory array 22, respectively, by controlling a selector 35.

Initially, the address is set so that the contents of a write addressing circuit 23 specify the first row in the first column ($I_{1-1}$) of a memory array 21, and a first component of an input pattern vector $a_{j-r}$ is written at the specified location. It is assumed that the input pattern vector $a_{j-r}$ has M components. Next, the column specifying section of the write addressing circuit 23 is incremented by one to specify a location $I_{1-2}$, at which a second component, subsequent to the first component, is written. By the repetition of this operation, the M components of the input pattern vector $a_{j-r}$ are all written into the first row in the memory array 21. Then, the row specifying section of the write addressing circuit 23 is incremented by one, and the column specifying section thereof is made to specify the first column. As a result, the address refers to a location $I_{2-1}$ (the second row in the first column). In a manner similar to that just described, the data about the input pattern vector $a_{j-r+1}$ are all written into the second row. A similar writing operation is continued until the data about the input pattern vector $a_{j+r}$ have been all written in the (2r+1)th row.

In addition, the address in circuit 24 is set so that the contents of a write addressing circuit 24 specify the first row in the first column ($S_{1-1}$) of a memory array 22, and a first component of the standard pattern vector $b_j$ is written at that location. Next, the column specifying section of the write addressing circuit 24 is incremented by one to write a second component of the standard pattern vector $b_j$ at a location in a subsequent column ($S_{1-2}$). By the repetition of this operation, the data about the standard pattern vector $b_j$ are all written into the first row ($S_{1-1}$ to $S_{1-M}$) of the memory array 22.

Upon completion of the above write processing, the write addressing circuit 23 is holding an address which specifies the (2r+1)th row and the Mth column ($I_{(2r+1)-M}$), while the write addressing circuit 24 is holding an address which specifies the first row and the Mth column ($S_{1-M}$). The row specifying section of addressing circuits 23, 24 are now each incremented by one, and the column specifying section of each circuit 23, 24 is also incremented by one to indicate "1", corresponding to the first column of each memory array. As a result, the contents of the address specifying circuit 23 specify $I_{(2r+2)-1}$, while the contents of the write addressing circuit 24 specify $S_{2-1}$. On the other hand, in the reading mode, the address is set so that the read addressing circuit 25 specifies the first row in the first column ($I_{1-1}$). When a reading operation is executed under this state, the first two components of the input pattern vectors $a_{j-r}$, $a_{j-r+1}$ (i.e., the data at $I_{1-1}$ and the data at $I_{2-1}$) are simultaneously set into registers 26, 27, respectively, and the first component of the standard pattern vector $b_j$ (i.e., the data at $S_{1-1}$) is set into a register 28 at the same time. Next, when the column specifying section of the read addressing circuit 25 is incremented by one, the second components of the pattern vectors $a_{j-r}$, $a_{j-r+1}$, $b_j$ (i.e., the data at $I_{1-2}$, $I_{2-2}$, $S_{1-2}$, respectively) are simultaneously set into the registers 26, 27, 28, respectively. More specifically, every time a reading operation is executed, it is possible to simultaneously obtain three data signals required for effecting two distance calculating operations. If a distance calculating device 29 is coupled to the registers 26, 28 and a distance calculating device 30 is coupled to the the distance $d_{j-r, j}$ and the distance $d_{j-r+1, j}$ can be simultaneously obtained by repeating the processing operation M times.

Next, the address in the row specifying section of the read addressing circuit 25 is incremented by two, while the address in the column specifying section thereof is incremented by one. This time, the distance $d_{j-r+2, j}$ and the distance $d_{j-r+3, j}$ can be simultaneously obtained by repeating the processing operation M times in the manner described hereinabove. By repeating of the above processing operation, it is possible to obtain the following distances:

$$d_{j-r, j}, d_{j-r+1, j}, \ldots, d_{j+r, j}$$

Required distances are what are obtained by incrementing j by one as follows:

$$d_{j+1-r, j+1}, d_{j+1-r+1, j+1}, \ldots, d_{j+1+r, j+1}$$

Therefore, what are newly required in the memory arrays 21, 22 are only the following two vectors:

$$a_{j+r+1}, b_{j+1}$$

Since the write addressing circuits 23, 24 are specifying the (2r+2)th row in the first column ($I_{(2r+2)-1}$) and the second row in the first column ($S_{2-1}$), the first component of the input pattern vector $a_{j+r+1}$ is written into the memory array 21. Then, the address of the column specifying section of the write addressing circuit 23 is incremented by one, and the second component of the input pattern vector $a_{j+r+1}$ is written into the memory array 21. By the repetition of the operation of successively incrementing the address of the column specifying section by one, the data about the input pattern vector $a_{j+r+1}$ are all stored in the (2r+2)th column in the memory array 21. On the other hand, the first component of the standard pattern vector $b_{j+1}$ is written at the location $S_{2-1}$ in the memory array 22. Then, by the repetition of the operation of successively incrementing the address of the column specifying section of the write addressing circuit 24 by one, the data about the standard pattern vector $b_{j+1}$ are all stored in the second column ($S_{2-1}$ to $S_{2-M}$) in the memory array 22. Since the regions for writing data in the memory arrays 21, 22 and the region for reading out data therefrom do not overlap each other, the writing and reading operations can be carried out independently of each other.

Assuming now that the reading cycle and the distance calculating operation executing cycle are the same length, i.e., $t_A$ and the writing cylce is $t_B$, the time $T_A$ required for calculating distances between a standard pattern at one point of time and a series of input patterns is expressed as follows:

$$T_A = \left[ \frac{2r+1}{2} \right] \times M \times t_A$$

On the other hand, the time $T_B$ required for writing data into the memory arrays 21, 22 for carrying out the calculations for determining the distances between a standard pattern at a subsequent point in time and a series of input patterns is expressed as follows:

$$T_B = 2 \times M \times t_B$$

If the condition of $T_A$ $T_B$ is satisfied, it is possible to constantly obtain data required for the distance calculating unit by executing the reading and writing operations in parallel with each other, so that waste is completely eliminated.

Thus, according to this embodiment, the memory access time can be greatly reduced, so that the arithmetic unit can effect an efficient processing operation. Accordingly, the memory system can well satisfy the high-speed properties required for the recognition processing.

It is to be noted that although the memory array 2 has only one data output means in the above-described embodiment, it is easy to improve such that the memory array 2 is constituted by four rows and M columns and provided with two data output means. In such a case, if the arrangement is such that components of the standard pattern vectors $b_j$ and $b_{j+1}$ can be obtained through the two data output means, then it is also possible to obtain four distances by repeating the reading and calculating operations M times. Moreover, it will be obvious that three distances can be obtained by adding another data output means to the memory array 21 in accordance with the above embodiment.

What is claimed is:
1. A memory system comprising:
first and second memory blocks;
first and second arithmetic devices;
an addressing means for supplying a first addresss commonly to said first and second memory blocks;
means for simultaneously reading out first and second data from said first memory block by said first address during a one memory access period;
means for reading a third data from said second memory block by said first address during said one memory access period simultaneously with the reading out of said first and second data; and
means for supplying said first and third data to said first arithmetic device and simultaneously supplying said second and third data to said second arithmetic device.

2. A memory system comprising:
memory means having at least three memory banks each of which stores a plurality of data;
an address register for storing an address;
a decoder coupled to said address register and said memory means for decoding a part of said address stored in said address register to designate corresponding memory locations in said at least three memory banks;
means responsive to said decoder for simultaneously reading the data in the memory locations of said at least three memory banks designated by said decoder;
a first means coupled to said reading means for selecting one data from the at least three read-out data in response to another part of said address;
means for adding a predetermined value to said another part of said address;
a second means coupled to said reading means and said adding means for selecting another one data from said at least three read-out data in response to the added value of said another part of said address;

means for transferring said one data and said another data selected by said first means and said second means to a utilization means; and utilization means for operating on said one data and said another data.

3. A memory system as claimed in claim 2 further comprising means coupled to said memory means for writing new data, during the period when said at least three data are read out of said memory means by said reading means, into the memory bank from which a data is read out by said reading means and not selected by said first and second means.

4. A memory system as claimed in claim 2, further comprising:

another memory means having at least two memory banks each for storing a plurality of data;

means responsive to a part of the address stored in said address register for designating a corresponding memory location in each of the at least two memory banks of said another memory means;

means responsive to another part of the address stored in said address register for selecting one of said at least two memory banks of said another memory means;

means for reading the data at the designated memory location of the selected one of said at least two memory banks; and means for transferring the data read from the designated memory location of the selected one of said at least two memory banks to said utilization means.

5. A memory as claimed in claim 4, further including writing means coupled to said another memory means for writing data into a memory bank of said another memory means not selected by the selecting means, while the data is read from the designated memory location of the selected one of said at least two memory banks.

6. A speech recognition system adapted to the dynamic pattern matching method in which a feature vector, $a_i$, at point i, extracted from input speech information is compared against stored reference pattern, $b_j$, at point j, for determining the feature vector which most closely corresponds to the reference pattern, said speech recognition system comprising:

means for receiving feature vector data corresponding to input speech information;

memory means for storing reference pattern data;

a first memory array for receiving a plurlaity of said feature vectors;

a second memory array for receiving at least one reference pattern;

first write address means for write addressing said first memory array;

second write address means for write addressing said second memory array;

read address means for simultaneously read addressing said first and second memory arrays at a first address location in each memory array, said read address means including address incrementing means for read addressing a second address location in said first memory array, simultaneous with the read addressing of said first address location;

first and second data register means associated with said first memory array;

third data register means associated with said second memory array;

means for transferring the feature vector data stored at said first address location in said first memory array to said first register means;

means for transferring the feature vector data stored at said second address location in said second memory array to said second register means;

means for transferring the reference pattern stored at said first address location in said second memory array to said third register means; and means for simultaneously comparing the reference pattern stored in said third register means with the feature vector data stored in said first register means and the feature vector data stored in said second register means.

7. The speech recognition system of claim 6, wherein said first memory array is comprised of N rows and M columns and said read address means includes, an address register means for designating both row and column address information, a first portion of the address in said address register designating column address information, a second portion of the address in said address register designating row address information, decoder means responsive to said first portion of the contents in said address register means for accessing common column locations in each row of said first memory array, first and second multiplexor means each receiving the data at the common column locations of the N rows of said first memory array designated by the first portion of the address in said address register means, said second portion of the address stored in said address register being inputted to said first multiplexor means and said address incrementing means, the output of said address incrementing means being connected to said second multiplexor means, the outputs from said first multiplexor means being connected to said first data register means, the outputs from said second multiplexor means being connected to said second data register means.

8. The speech recognition system of claim 7, wherein said means for simultaneously comparing the reference pattern with feature vector patterns stored in said first and second data registers is comprised of a first calculating means having inputs connected to the outputs of said first and third data registers and for calculating the distance $d_{i,j}$ between the feature vector $a_i$ and the reference pattern $b_j$, and a second calculating means having inputs connected to the outputs of said second and third data registers and for calculating the distance $d_{i+1,j}$ between the feature vector $a_{i+1}$ and the reference pattern $b_j$ simultaneous with the calculation of the distance $d_{i,j}$.

9. The speech recognition system of claim 6, in which feature vectors occurring in the range $j-r \leq i \leq j+r$ are compared to a reference pattern $b_j$, said first memory array being comprised of $2_{r+2}$ rows and M columns $2_{r+1}$ rows storing feature vector data corresponding patterns $a_{j-r}, a_{j-r+1}, \ldots a_j, \ldots a_{j+r}$ to be compared to reference pattern $b_j$, the $2_{r+2}$ row storing the feature vector pattern $a_{j+r+1}$, said second memory array being comprised of at least two rows and M columns, said first row storing said referene pattern $b_j$, said second row storing said reference pattern $b_{j+1}$ against which is compared feature vectors in the range $j-r+1 \leq i \leq j+r+1$.

10. In a speech recogniation system adapted for dynamic pattern matching, a method for determing distances $d_{i,j}, d_{i+1,j+1}, \ldots d_{i+n}, d_{j+n}$ between feature vectors $a_i, a_{i+1} \ldots a_{i+n}$ where $j-r \leq i \leq j+r$ and reference patterns $b_j, b_{j+1}, \ldots b_{j+n}$ comprising the steps of:

providing a first memory array of $2_{r+2}$ rows and M columns and storing $2_{r+1}$ feature vectors in said first array;

providing a second memory array of at least two rows and M columns;

writing into said first array the feature vectors $a_i$ corresponding to $a_{j-r}, a_{j-r+1}, \ldots a_j, \ldots a_{j+r}$;

writing into said second array the reference pattern $b_j$;

simultaneously reading two feature vectors $a_i$ and $a_{i+1}$ and the reference pattern $b_j$ out of said first and second memory arrays; and simultaneously calculating the distances $d_{i,j}$ from the vector $a_i$ and reference $b_j$ and $d_{i+1,j}$ from the vector $a_{i+1}$ and the reference $b_j$.

11. The method for determining distances $d_{i,j}, d_{i+1,j+1}, \ldots d_{i+n, j+n}$ according to claim 10, further including the steps of:

writing the feature vector $a_{j+1+r}$ into the $2_{r+2}$ row of said first memory array, writing the reference pattern $b_{j+1}$ into the second row of the second memory array; and reading two feature vectors $a_i$ and $a_{i+1}$ where $j-r \leq i \leq j+r-1$ and reference pattern $b_j$ simultaneously with the writing of feature vector $j+1+r$ into first memory array and the writing of the reference pattern $b_{j+1}$ into the second memory array.

* * * * *